July 28, 1964 H. C. THEUERER 3,142,596
EPITAXIAL DEPOSITION ONTO SEMICONDUCTOR WAFERS THROUGH AN INTERACTION BETWEEN THE WAFERS AND THE SUPPORT MATERIAL
Filed Oct. 10, 1960
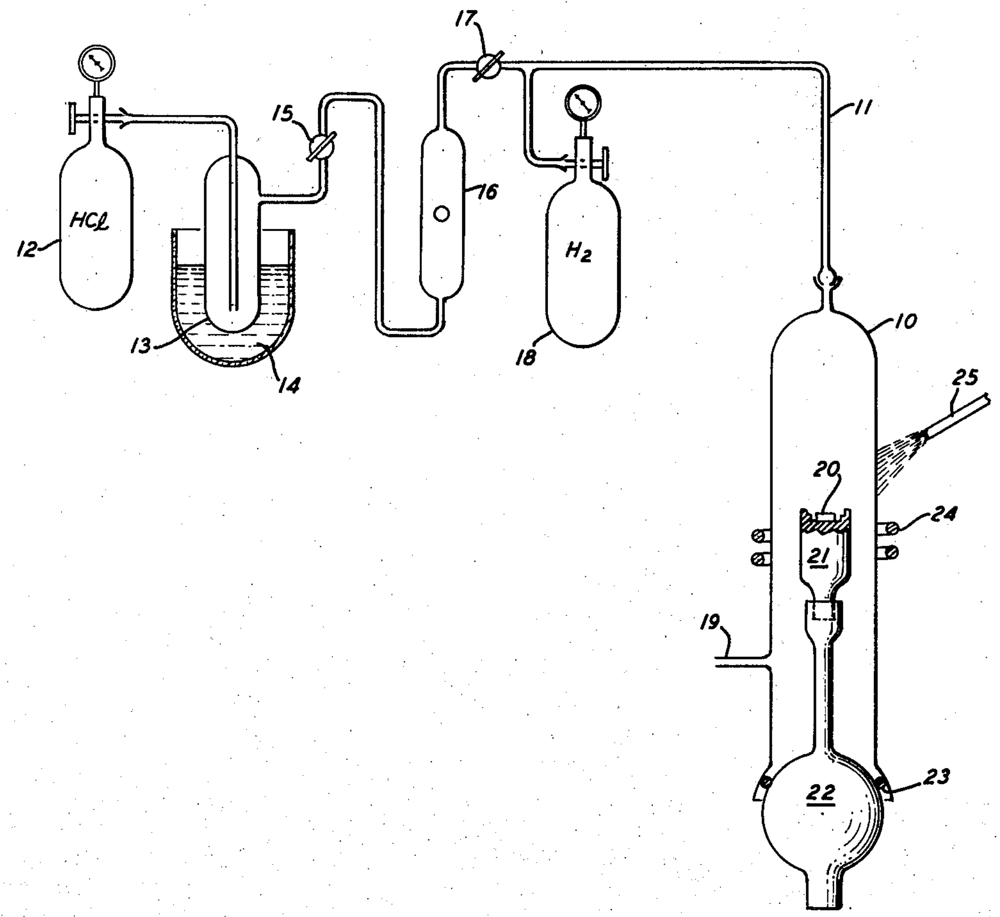
INVENTOR
H. C. THEUERER
BY
George S. Indig
ATTORNEY 3,142,596

EPITAXIAL DEPOSITION ONTO SEMICONDUCTOR WAFERS THROUGH AN INTERACTION BETWEEN THE WAFERS AND THE SUPPORT MATERIAL

Henry C. Theuerer, New York, N.Y., assignor to Bell Telephone Laboratories, Incorporated, New York, N.Y., a corporation of New York Filed Oct. 10, 1960, Ser. No. 61,505
9 Claims. (Cl. 148—175)

This invention relates to a novel procedure for the mass transfer of semiconductor materials particularly in forming thin layers on substrates. This invention is specifically adapted to the formation of epitaxial layers on desired semiconductor substrates and an improved method for the control of resistivities of the layer and the substrate.

The procedure of this invention relies essentially on a vapor transfer phenomenon of semiconductor material from a solid phase source to the substrate. This transfer mechanism involves a preferential oxidation of the source material to a vapor state and a transfer of the vapor to the substrate, each of these occurring by virtue of a well-defined spatial relation and temperature gradient.

Epitaxial layers of semiconductors of various conductivities, as desired, on semiconductor or conducting surfaces, have recently become of interest in the manufacture of semiconductor devices, particularly various forms of transistors. The uses and requirements of epitaxial layers are now well established in the art and various particular devices utilizing such layers and their prescribed uses can be found, for instance, in copending application, Serial No. 35,152, filed June 10, 1960.

The transfer procedure of this invention requires a transfer block or wafer having the composition and conductivity desired in the layer to be formed and a substrate of a desired material to which the material of the transfer block is transferred. In the formation of epitaxial layers, the substrate material and the material of the layer must have compatible crystal lattice structures which is a known requirement in the art. Otherwise, any two semiconductor materials may be chosen for the layer and the substrate.

The transfer material and the substrate are then mounted in a container, such as a quartz tube, and the container is filled with a halogen-containing gas preferably diluted with $H_2$, $N_2$ or an inert diluent gas such as He or A. The transfer block and the substrate are heated to a temperature dependent upon the melting points of the materials chosen, and preferably just below the melting point of the lowest melting component. However, during the transfer operation a temperature gradient in the range of 10° C. to 100° C. must always be maintained between the transfer block and the substrate if effective transfer is to be obtained. The transfer material is maintained at the higher temperature most conveniently by disposing the heating element adjacent to it. Such gradients are reasonably easy to obtain in this temperature range but due to the varying geometries of the apparatus, the type and the location of the heating element or the size of the transfer block and substrate, the gradient is most reliably obtained empirically.

A further critical parameter of this procedure is the relative spacing between the transfer material and the substrate. It has been found that no significant transfer of material occurs when these two elements are separated by distances greater than 10 microns. Closer spacings are effective with no minimum limitation except that highly-polished, flat surfaces placed together in contact so as to prevent a molecular path for the oxidizing halogen-containing gas are ineffective. Ordinary surfaces, as customarily used in this art, can be placed in contact and effective transfer is obtained. Accordingly, the most convenient method for meeting the critical spatial relation is to place the members in contact.

This extremely close spacing requirement leads to one of the distinct advantages of this transfer procedure. A pattern formed in the transfer block more than 10 microns deep will produce a replica of that pattern on the substrate since effective transfer occurs only at the raised portion of the transfer block in contact or within 10 microns of the substrate. In this manner a single transfer block with a deeply-etched pattern may be used to form many patterned layers, thus eliminating the need for masking individual substrates.

A typical apparatus for carrying out the procedure of this invention is shown in the drawing in which:

The figure is a schematic view of the apparatus as adapted to one particular procedure for practicing the invention.

The figure shows quartz tube 10 attached to line 11 which is the source of the halogen-containing gas, here HCl, and the diluent gas, $H_2$. The HCl in tank 12 is passed through a cooling chamber 13 which is immersed in Dry Ice and alcohol 14 at a temperature of −80° C. The gas is then passed through control valve 15, flowmeter 16, and another control valve 17 into tube 11 where the diluent gas $H_2$ contained in tank 18 is added to the gas stream. Near the base of the quartz tube is an exit tube 19 which provides an exhaust for the diluted HCl. The substrate 20 is placed in contact with a support body of the transfer material 21 which is in turn supported by support 22, which is sealed in the base of the quartz tube 10 by O-ring 23. A two-coil induction heater 24 and a nozzle 25 placed so as to form a water curtain over the tube 10 complete the apparatus.

*Example I*

In this example two wafers are employed, one as the substrate, the other as the transfer material. The first wafer is the transfer wafer and consists of n-type silicon. This wafer is placed in a silicon support and mounted in a quartz tube as shown in the figure. A second wafer constituting the substrate weighing 31.15 mg. and consisting of p-type silicon is placed on top of the first wafer in contact therewith. Each wafer is previously polished, etched in $HNO_3 \cdot HF$, rinsed with deionized water washed with ethylene dichloride, boiled in HCl and rinsed again with deionized water. Both wafers are then sealed in a quartz tube and heated with the heating coil as shown. Pure hydrogen gas is initially introduced through tube 11 to insure a clean system. The hydrogen flow for this pretreating step is 1 liter/min. and the duration is one-half hour. During this operation, the silicon support is maintained at a temperature of approximately 1200° C. After the pretreatment, a mixture of hydrogen containing approximately 2% HCl is introduced into the quartz tube at a rate of approximately one liter per minute. This transfer step lasts five minutes. During this period the temperature of the lower wafer is 1220° C. while the temperature of the upper wafer is 1180° C.

Upon termination of the transfer step, the apparatus is cooled and examination of the wafers reveals the following:

The lower wafer is etched out but only in regions where covered by the upper wafer. The upper wafer shows a weight gain of 2.31 mg. and when cut in half, polished and etched, is found to have a layer of silicon of the order of 10 microns in thickness covering its bottom face. This layer is a good single crystal having a 111 crystal orientation the same as the substrate.

*Example II*

A run similar to that of Example I, conducted to show that the conductivity of the layer is essentially the same as the conductivity of the transfer block illustrates the reproducability of conductivity types and values permitted by this invention. Two wafers are used as before. The transfer wafer is n-type silicon having an impurity concentration of approximately $1.5 \times 10^{14}$ atoms/cm.$^3$ and a resistivity of 31 ohm-cm. The substrate is p-type silicon. The mass transfer procedure is virtually identical to that of Example I except that the atmosphere is $H_2$ saturated with $SiCl_4$ at —30° C. The deposited film has a thickness of approximately .406 mil and upon examination is found to be n-type silicon with an impurity concentration of approximately $1.4 \times 10^{14}$ atoms/cm.$^3$ and a resistivity of 33.4 ohm-cm.

From this example it is seen that merely through control of the starting materials the conductivity of the layer may be precisely controlled. In other words, no process variable is required to be controlled as the dominant factor in determining the conductivity of the desired layer. Thus the procedure of this invention provides an easy, yet effective and reliable, means of controlling or duplicating conductivity types and resistivity values.

*Example III*

This example is included to show the effectiveness of this transfer operation in forming layers of a prescribed configuration without any masking of the substrate.

To illustrate this, a single wafer used as a substrate is placed in a silicon pedestal similar to that appearing in the figure. The silicon pedestal acts as a transfer body and has a series of concentric rings ground in its upper surface. The wafer is placed in contact with these rings and sealed in the quartz tube as before. The apparatus is flushed with hydrogen and the pretreatment step is conducted as in Example I. In this example during the transfer operation, the halogen-containing gas is $H_2$ saturated with $SiCl_4$ at —30° C. During the transfer step the single wafer substrate is maintained at approximately 1140° C. while the pedestal constituting the transfer body is approximately 40° C. hotter. The gas flow during this step is at the rate of about 1 liter/min. for a duration of five minutes. After a final five minutes flush with pure $H_2$ the single wafer substrate carries a silicon layer covering only those areas in contact with the silicon pedestal. An exact replica of the rings of the pedestal appears on the substrate.

*Example IV*

This example describes the transfer of GaAS to a wafer of Ge using essentially the technique of Example I.

A wafer of p-type GaAs is etched in a solution of three parts $H_2SO_4$, one part $H_2O_2$ (30%) and one part water, then rinsed in deionized water and dried.

A germanium wafer is washed in CP–4, rinsed in deionized water and dried.

Both wafers are placed on a graphite pedestal, the Ge substrate wafer overlying the GaAs transfer wafer. The remainder of the apparatus is essentially identical to that shown in the figure. The graphite holder is then heated by the induction coil. The lower transfer wafer attains a temperature of 834° C., while the upper substrate wafer is at a temperature of 775° C. During the heating $H_2$ saturated with HCl at —78° C. is admitted to the chamber at a rate of 20 cc./min. This transfer operation lasts six minutes after which the HCl supply is shut off and a pure hydrogen gas flush admitted for three minutes. At the termination of the run, the upper germanium substrate shows a p-type layer of GaAs covering the area of the substrate in which it had been in contact. This layer is approximately 2.2 mils in thickness.

*Example V*

This example is included to show the transfer of Ge from a Ge wafer to a Si substrate.

A p-type germanium wafer and an n-type silicon wafer are pretreated as in the previous examples. The Si wafer is placed overlying the germanium wafer and both wafers placed upon a silicon pedestal such as 21 in the figure. The apparatus and general procedure are the same as in the prior example. During the transfer operation the temperature of the transfer wafer is 750° C. and the temperature of the substrate is 715° C. At the termination of the run a layer of germanium .2 mil in thickness is found on the lower face of the silicon substrate.

*Example VI*

This example illustrates the adaptability of this transfer method to forming Si layers on Ge substrates.

A p-type Ge wafer and an n-type Si wafer are pretreated as before and placed on a silicon pedestal, this time with the Ge substrate wafer overlying the Si transfer wafer. The procedure is identical to the previous runs using HCl and $H_2$. The temperature of the Si transfer wafer during the transfer operation is 745° C. while the temperature of the Ge substrate is 705° C. Since the transfer of silicon is relatively slow at these temperatures, the transfer period is increased to 1 hour 45 minutes. A layer of silicon approximately 2.1 microns is found on the lower surface of the germanium wafer.

The halogen-containing atmospheres of this invention may be HCl, $Cl_2$, $SiCl_4$, HBr, HI, $I_2$, $Br_2$, etc. Metal ion containing gases are to be avoided where they may be a source of impurities. The carrier gas may be $H_2$, $N_2$ or an inert gas such as He or A.

In the case of forming Si layers on Ge the duration of the transfer operation is typically much longer than in the opposite transfer process. As suggested by the examples the transfer of Ge to silicon or Si to Si requires only a few minutes whereas a significant transfer of Si to Ge requires a few hours. Thus transfer of lower melting semiconductors to high melting substrates should be chosen wherever possible.

As stated previously this procedure is particularly adapted to the formation of epitaxial layers in which the layer is a single crystal having the same orientation as the substrate. In forming epitaxial layers device requirements often dictate that the substrate and the epitaxial layer have a (111) crystallographic orientation. Thus a preferred embodiment of this invention is the use of this procedure to form single crystalline layers having a (111) orientation, the same as the substrate.

Various other modifications and variations of this procedure will become apparent to those skilled in the art. All such deviations which follow the basic teachings by which this invention has advanced the art are considered to be within the scope of this invention as defined by this specification and the appended claims.

What is claimed is:

1. A process for producing a layer of a semiconductor material on a substrate which comprises mounting said substrate and a transfer body of the semiconductor material desired in said layer essentially in contact with one another in an atmosphere comprising a halogen-containing gas, said substrate and said body being spaced within 10 microns of one another in a manner so as to provide a molecular path to the opposing surfaces of said body and said substrate, and heating the body and the substrate while maintaining the substrate at a temperature of from 10–100° C. less than the said transfer body whereby the material of said transfer body is transferred to said substrate.

2. The process of claim 1 wherein the transfer body and the substrate are silicon.

3. The process of claim 1 wherein the transfer body is germanium.

4. The process of claim 1 wherein the substrate is germanium and the layer is GaAs.

5. The process of claim 1 wherein the transfer body and the substrate are of opposite conductivity types.

6. The process of claim 1 wherein the said halogen-containing gas comprises HCl.

7. The process of claim 1 wherein the said halogen-containing gas comprises $SiCl_4$.

8. The process of claim 1 wherein the surface of the transfer body adjacent said substrate has an indented portion of a prescribed geometric configuration and wherein the indented portion of said transfer body is spaced from said substrate by a distance of at least 10 microns.

9. The process of claim 1 wherein the substrate has a (111) crystalline orientation and the layer formed is a single crystal having a (111) crystalline orientation.

References Cited in the file of this patent

UNITED STATES PATENTS

| | | |
|---|---|---|
| 2,470,305 | Gross | May 17, 1949 |
| 2,607,675 | Gross | Aug. 19, 1952 |
| 2,692,839 | Christensen et al. | Oct. 26, 1954 |
| 2,898,248 | Silvey et al. | Aug. 4, 1959 |
| 2,989,376 | Schaefer | June 20, 1961 |

OTHER REFERENCES

IBM Journal of Research and Development, vol. 4, No. 3, July 1960, pages 248–255.